United States Patent [19]

Solomon

[11] Patent Number: 5,036,203
[45] Date of Patent: Jul. 30, 1991

[54] SUPERIMPOSED DETECTOR ARRAYS HAVING OPTICAL FILTERS

[75] Inventor: Allen L. Solomon, Fullerton, Calif.

[73] Assignee: Grumman Aerospace Corporation, Bethpage, N.Y.

[21] Appl. No.: 454,035

[22] Filed: Dec. 20, 1989

[51] Int. Cl.$^5$ .................................. H01L 49/02
[52] U.S. Cl. .......................... 250/370.06; 250/370.13; 250/339
[58] Field of Search ............... 250/370.13, 370.06, 250/339, 338.4; 378/156

[56] References Cited

U.S. PATENT DOCUMENTS

| | | | |
|---|---|---|---|
| 3,962,578 | 6/1976 | Roschen | 250/226 |
| 4,561,001 | 3/1987 | Harada et al. | 250/370.06 |
| 4,578,809 | 3/1986 | Macouski | 378/62 |
| 4,618,763 | 10/1986 | Schmitz | 250/211 |
| 4,677,451 | 6/1987 | Parsons et al. | 357/22 |
| 4,792,672 | 12/1988 | Schmitz | 250/211 |
| 4,794,092 | 12/1988 | Solomon | 437/51 |
| 4,948,976 | 8/1990 | Baliga et al. | 250/370.06 |

FOREIGN PATENT DOCUMENTS 0102530  6/1985  Japan .............. 250/370.13

OTHER PUBLICATIONS

Champman et al., "Monolithic HgCdTe Charge Transfer Device Infrared Imaging Arrays", *IEEE Transactions on Electron Devices*, vol. ED-27, No. 1, Jan. 1980, pp. 134–145.

Primary Examiner—Carolyn E. Fields
Assistant Examiner—James E. Beyer
Attorney, Agent, or Firm—Stetina and Brunda

[57] ABSTRACT

An infrared detector array which is simultaneously responsive to two different portions of the infrared spectrum is disclosed. The array has detector elements formed upon the two opposite planar surfaces of a substrate. The detector elements formed upon the first surface of the substrate are responsive to a first portion of the infrared spectrum and the detector elements formed upon the second surface of the substrate are responsive to a second portion of the infrared spectrum. An intermediate layer of single crystalline material can be formed upon one or both surfaces of the substrate between the substrate and the dector elements. This intermediate layer of single crystalline material filters infrared radiation not within the second portion of the infrared spectrum to reduce the amount of infraed radiation not within the second portion of the infrared spectrum which is incident upon the detector elements formed upon the second surface of the substrate. The detector elements formed upon the first surface of the detector array may be specifically formed to be more responsive to infrared radiation within the first portion of the infrared spectrum than to infrared radiation within the second portion of the infrared spectrum. A second embodiment is disclosed wherein an array of non-single crystalline inerference filters is formed upon one surface of the substrate and a single crystalline detector is then grown graphotaxially through a small hole in each non-single crystalline interference filter.

8 Claims, 2 Drawing Sheets

SUPERIMPOSED DETECTOR ARRAYS HAVING OPTICAL FILTERS

FIELD OF THE INVENTION

The present invention relates generally to infrared detectors and more particularly to an infrared detector array which is simultaneously responsive to two different portions of the infrared spectrum. The array has detector elements formed upon the two opposite planar surfaces of a substrate. The detector elements formed upon the first surface of the substrate are responsive to a first portion of the infrared spectrum and the detector elements formed upon the second surface of the substrate are responsive to a second portion of the infrared spectrum. An intermediate layer of single crystalline material can be formed upon one or both surfaces of the substrate between the substrate and the detector elements. This intermediate layer of single crystalline material filters infrared radiation not within the second portion of the infrared spectrum to reduce the amount of infrared radiation not within the second portion of the infrared spectrum which is incident upon the detector elements formed upon the second surface of the substrate. The detector elements formed upon the first surface of the detector array may be specifically formed to be more responsive to infrared radiation within the first portion of the infrared spectrum than to infrared radiation within the second portion of the infrared spectrum. A second embodiment is disclosed wherein an array of non-single crystalline interference filters is formed upon one surface of the substrate and a single crystalline detector is then grown graphotaxially through a small hole in each non-single crystalline interference filter.

BACKGROUND OF THE INVENTION

The infrared spectrum covers a range of wavelengths longer than the visible wavelength, but shorter than microwave wavelengths. Visible wavelengths are generally regarded as between 0.4 and 0.75 micrometers. The infrared wavelengths extend from 0.75 micrometers to 1 millimeter. The function of an infrared detector is to respond to the energy of a wavelength within some particular portion of the infrared region.

All materials generate radiant energy having characteristic wavelengths within the infrared spectrum depending upon the temperature of the material. Many current infrared image detection systems incorporate arrays with large numbers of discrete, highly sensitive detector elements, the electrical outputs of which are connected to signal processing circuitry. By analyzing the pattern and sequence of detector element excitations, the processing circuitry can identify and track sources of infrared radiation.

Infrared detector arrays which have more than a single spectral response are known. These arrays typically shift the image to separate detector elements which have the desired spectral responses. In this manner separate detector elements are used to sense separate portions of the infrared spectrum. Such infrared detector arrays require electro-mechanical and optical mechanisms to shift the image from one portion of the array to another. They also require arrays having a significantly large surface area to accommodate the detector elements needed for each of the desired spectral responses.

As such, although the prior art has recognized the problem of fabricating a compact infrared detector array having two separate spectral responses, the proposed solutions have to date been ineffective in providing a satisfactory remedy.

SUMMARY OF THE INVENTION

The present invention comprises an infrared detector array which is simultaneously responsive to two different portions of the infrared spectrum. The array has detector elements formed upon two opposite parallel planar surfaces of a substrate. The detector elements formed upon the first surface of the substrate are responsive to a first portion of the infrared spectrum and the detector elements formed upon the second surface of the substrate are responsive to a second portion of the infrared spectrum. An intermediate layer of single crystalline material can be formed upon one or both surfaces of the substrate between the substrate and the detector elements. This intermediate layer of single crystalline material filters infrared radiation not within the second portion of the infrared spectrum to reduce the amount of infrared radiation not within the second portion of the infrared spectrum which is incident upon the detector elements formed upon the second surface of the substrate. The detector elements formed upon the first surface of the detector array may be specifically formed to be more responsive to infrared radiation within the first portion of the infrared spectrum than to infrared radiation within the second portion of the infrared spectrum. A second embodiment is disclosed wherein an array of non-single crystalline interference filters is formed upon one surface of the substrate and a single crystalline detector is then grown graphotaxially through a small hole in each non-single crystalline interference filter.

The spectral response of HdCdTe detector elements can be modified by varying the ratio of Hg to Cd of the single crystalline HgCdTe material. Increasing the ratio of Hg to Cd causes a detector element to absorb and be more sensitive to longer wavelength infrared radiation. Conversely, decreasing the ratio of Hg to Cd causes the detector element to absorb and be more sensitive to shorter wavelength infrared radiation. In this way, the absorption and response characteristics of the detector elements can be tuned such that shorter wavelength radiation is absorbed by the detector elements formed upon the first side of the substrate and longer wavelength infrared radiation is absorbed by the detector elements formed upon the second surface of the substrate, for example.

DETAILED DESCRIPTION OF THE PREFERRED EMBODIMENT

The detailed description set forth below in connection with the appended drawings is intended merely as a description of the presently preferred embodiments of the invention, and is not intended to represent the only form in which the present invention may be constructed or utilized. The description sets forth the functions and sequence of steps for construction and implementation of the invention in connection with the illustrated embodiments. It is to be understood, however, that the same or equivalent functions and sequences may be accomplished by different embodiments that are also intended to be encompassed within the spirit and scope of the invention.

The superimposed detector array of the present invention is illustrated in FIGS. 1-6 of the drawings which depict a presently preferred embodiment of the invention.

Figure 1:
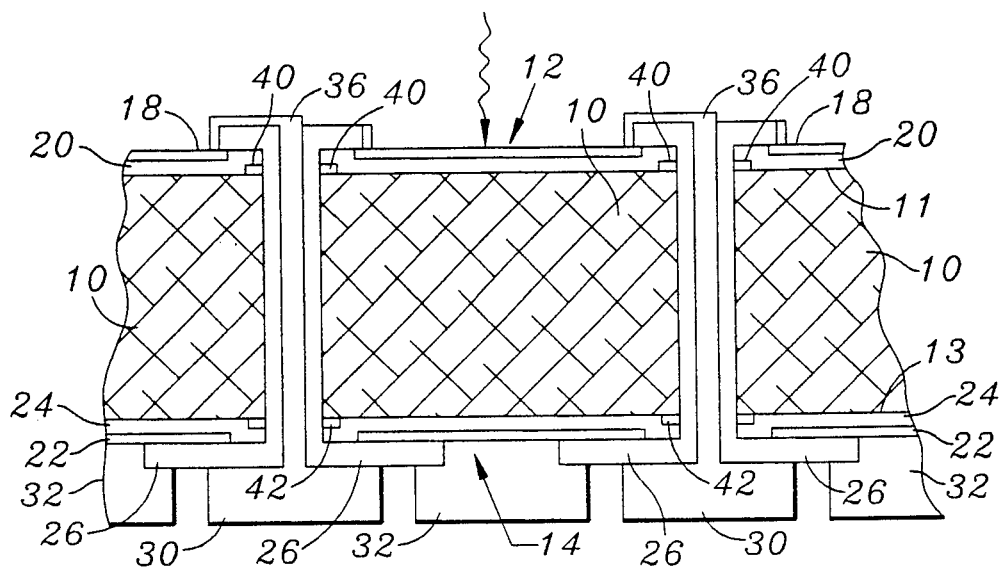
FIG. 1 is a cross-sectional side view of a superimposed detector element array.

Referring now to FIG. 1, a substrate 10 has first 12 and second 14 p-n junction photodiode detector elements formed upon its first 11 and second 13 surfaces respectively.

The photodetectors 12 formed upon the first surface 11 of substrate 10 are comprised of a material of a first type 18 and a material of a second type 20. The material of a first type is, for instance, n-type single crystalline HgCdTe. The material of the second type is, for instance, p-type single crystalline HgCdTe. The detector elements 14 formed upon the second surface 13 of substrate 10 likewise are comprised of material of a first type 22 and material of second type 24.

The first 11 or upper surface of the superimposed detector array is irradiated with infrared radiation which is incident upon the first 12 and second 14 detector elements. The substrate 10 is essentially transparent to this infrared radiation.

Bump contacts 30 and 32 formed upon the second surface 13 of the substrate 10 provide electrical connection from the detector elements 12 and 14 to signal processing circuitry (not shown).

In the preferred embodiment of the present invention first detector elements 12 are formed of HgCdTe having a comparatively low ratio of Hg to Cd such that the shorter wavelengths of infrared radiation are absorbed and detected, whereas the longer wavelengths of infrared radiation tend to be transmitted through the substrate to the second detectors 14, where it is absorbed and detected.

Bump contacts 32 attach directly to the material of a first type 22 of the second detector elements 14. Bump contacts 30 are electrically connected to the material of first type 18 of detector elements 12 by conductive conduits 36 which pass through vias formed in substrate 10. An insulating layer 26 insulates the conductive conduit 36 from the substrate 10 and the material of a second type 20 of detector elements 12. Insulating layer 26 also insulates bump contacts 30 from second detector elements 14. Bump contacts 32 attach directly to the material of a first type 22 of second detector elements 14.

Conductive grid 40 formed upon the first surface 11 of substrate 10 provides electrical interconnection between the material of a second type 20 of all detector elements 12 formed upon the first surface 11 of substrate 10. Conductive grid 42 likewise provides electrical interconnection between the material of a second type 24 formed upon the second surface of substrate 10.

Figure 5:
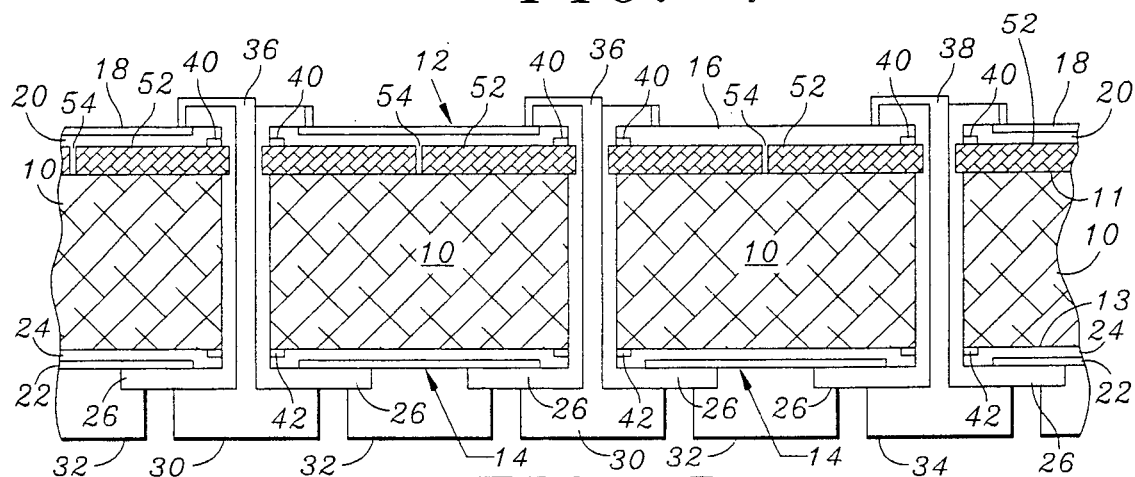
FIG. 5 is a cross-sectional side view of the superimposed detector element array having interference filters formed upon the upper surface of the array.
Figure 6:
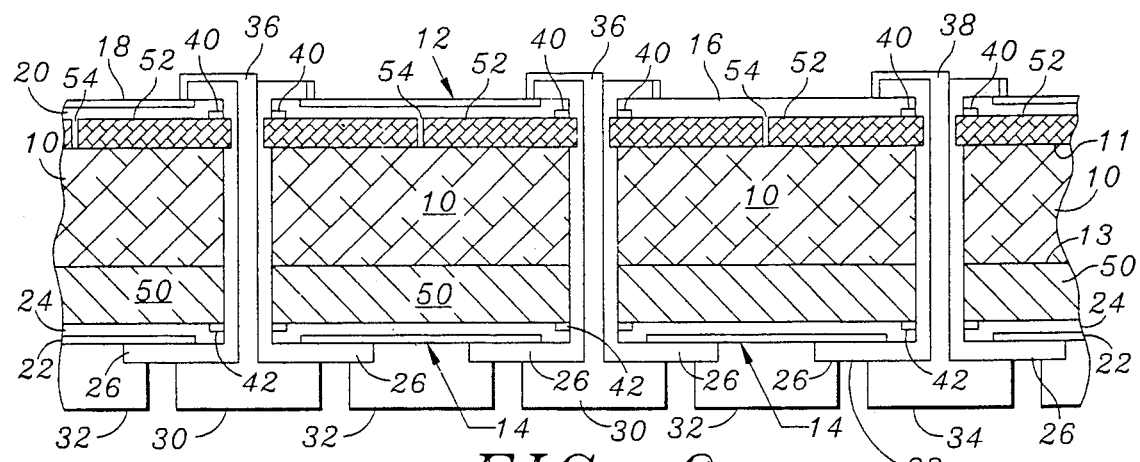
FIG. 6 is a cross-sectional side view of the superimposed detector array having interference filters formed upon the upper surface of the substrate and having an absorption filter formed upon the lower surface of the substrate.

A shown at FIGS. 5 and 6, typically only a single bump contact 34 is required to provide electrical connection via conductive conducts 38 to a single type layer 16, which has no p-n junction, on the second surface of substrate 10 to conductive grid 40 formed upon the first surface of substrate 10. A similar contact (not shown) to a single type layer may be used to electrically connect conductive grid 42 formed upon the second surface of substrate 10 to a bump contact 26.

Figure 2:
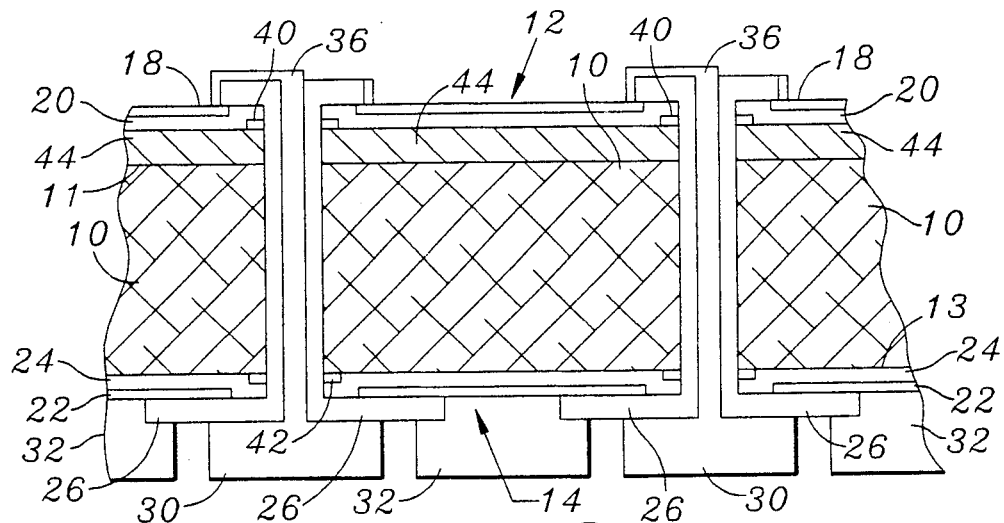
FIG. 2 is a cross-sectional side view of a superimposed detector element array having an absorption filter formed upon the upper surface of the substrate.

Referring now to FIG. 2, an absorption filter 44 may be formed intermediate the substrate 10 and the first detector elements 12. In the preferred embodiment this absorption filter is an epitaxially grown layer of HgCdTe having a ratio of Hg:Cd whose absorption characteristics extend to longer wavelengths than those absorbed by first detector elements 12. Filter layer 44 therefore absorbs infrared radiation at longer wavelengths than do the first infrared detectors 12. Therefore, only infrared radiation having a sufficiently long wavelength is transmitted through substrate 10 to second detector element 14. This increases the cut-in wavelength of the second detector elements 14 and sharpens their response. The response of the second detector elements 14 is sharpened since shorter wavelength infrared radiation is blocked by layer 44.

Figure 3:
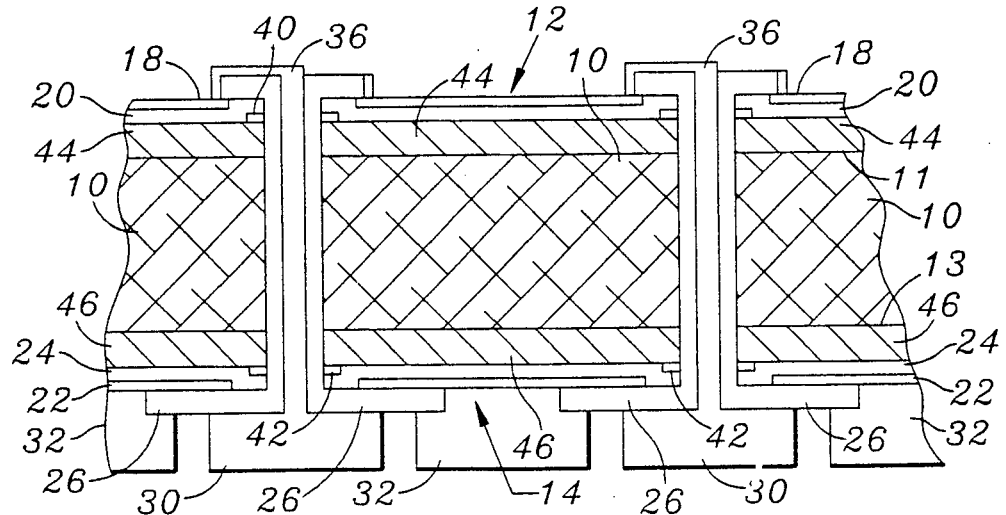
FIG. 3 is a cross-sectional side view of the superimposed detector array having absorption filters formed upon both the upper and lower surface of the substrate.

As shown in FIG. 3 a higher degree of filtering can be obtained by forming absorption filters 44 and 46 upon both the first 11 and second 13 surfaces of substrate 10. This increases the effectiveness of the filtering process, thereby helping to prevent shorter wavelength infrared radiation from reaching detector elements 14 to further sharpen their response.

Figure 4:
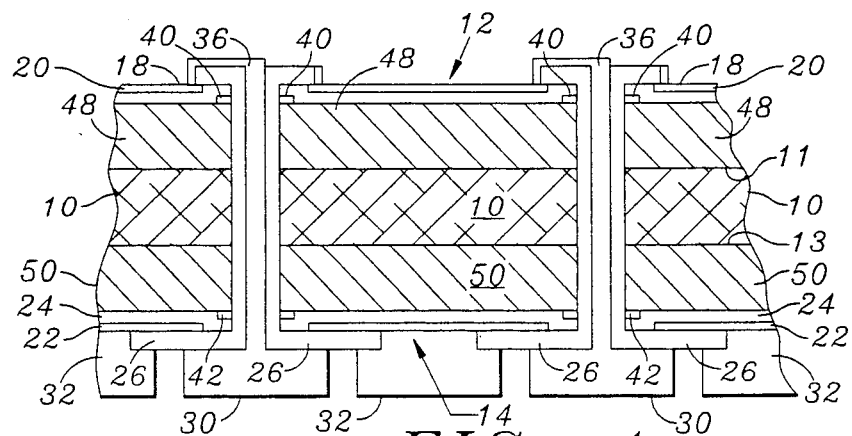
FIG. 4 is a cross-sectional side view of the superimposed detector array having thick absorption filters formed upon both the upper and lower surfaces of the substrate.

Referring now to FIG. 4, filter layers 48 and 50 provide even more effective filtering. Substrate 10 can be etched to provide room in which to form thick filters 48 and 50. Such etching is necessary because of a limitation upon the thinness of the array. The substrate 10 cannot be originally fabricated thin as shown in FIG. 4, because it would be too brittle and therefore susceptible to breakage during the handling and fabrication processes.

Referring now to FIG. 5, interference filters 52 can be formed upon the first surface 11 of substrate 10 such that they are intermediate substrate 10 and first detector elements 12. Interference filters 52 have narrow band transmitting characteristics which permit sharpening of the spectral response of second detector elements 14.

Interference filters 52 are comprised of a non-single crystalline material and therefore not suitable for the epitaxial formation of detector elements thereon. Detector elements 12 are therefore formed by graphotaxial growth from the single crystalline substrate 10 through an aperture 54 in each of the interference filters 52. This graphotaxial growth commences at the upper surface of substrate 10 and continues through aperture 54, from which it spreads across the upper surface of interference filters 52. In the preferred embodiment HgCdTe is grown graphotaxially from the CdTe substrate 10 through aperture 54 and across the upper surface of interference filter 52 to form a material of a second type 20 upon which material of a first type 18 is formed to provide first detector elements 12.

Graphotaxy, or lateral epitaxy, is the growth of a single crystalline layer across the surface of a non-single crystalline substrate by commencing growth at a single crystalline seed surface. In the present invention, this single crystalline seed surface is provided by the substrate 10. Growth takes place layer-by-layer upon the substrate 10 as it progresses through aperture 54. When it reaches the non-crystalline interference filter 52 upper surface, the single crystalline growth spreads laterally across the interference filter 52 upper surface. The substrate 10 establishes the crystalline structure and orientation of the graphotaxially grown layer. Once established, the structure and orientation are maintained since all growth originates from the same single crystalline seed surface.

The graphotaxy process is contrasted to conventional epitaxial growth where a crystal later is grown upon the surface of a single crystalline substrate. In epitaxial growth the entire surface of the substrate serves as a seed and must therefore be single crystalline to maintain single crystalline growth.

Referring now to FIG. 6, a combination of interference filters 52 and absorption filters 50 may be utilized to extend the range of wavelengths absorbed and to sharpen the cut-in for the longer wavelength second detector elements 14. The absorption filters 50 absorb shorter wavelength infrared radiation and therefore extend the response of the second detector elements 14 to longer wavelengths. The interference filters 52 transmit a narrow band of wavelengths within the infrared spectrum and therefore provide a sharp cut-in such that undesired shorter wavelengths are effectively blocked while the desired longer wavelengths are transmitted to the second detector elements 14.

It is understood that the exemplary superimposed detector arrays having optical filters described herein and shown in the drawings represent only a presently preferred embodiment of the invention. Indeed, various modifications and additions may be made to such embodiment without departing from the spirit and scope of the invention. For example, various materials may be utilized for the substrate and detector elements. Also, various filter element materials are contemplated. Thus, these and other modifications and additions may be obvious to those skilled in the art and may be implemented to adapt the present invention for use in a variety of different applications.

I claim:

1. An infrared detector array simultaneously having two separate spectral responses, for communicating signals representative of infrared radiation detected in two separate ranges of wavelengths to processing circuitry, the array comprising:
    (a) a common substrate having first and second substantially parallel planar surfaces;
    (b) at least one filter element disposed upon at least one of said first and second planar surfaces of said substrate for attenuating infrared radiation outside the second range of wavelengths prior to its being sensed by said second detector elements;
    (c) a plurality of first detector elements disposed generally adjacent the first planar surface of said common substrate for detecting infrared radiation in a first range of wavelengths, said first detectors being formed upon one of said at least one filter element and said substrate; and
    (d) a plurality of second detector elements, the number of second detector elements substantially conforming to the number of first detector elements, the second detector elements disposed generally adjacent the second planar surface of said common substrate for detecting radiation in a second range of wavelengths, said second detectors being formed upon one of said filter element and said common substrate, said second detector elements receiving infrared radiation after the infrared radiation has passed through said first detectors and said common substrate;
    (e) wherein said at least one filter element comprises an interference filter having at least one aperture formed therein, said interference filter formed intermediate said first detector elements and said second detector elements, the aperture providing an opening from said common substrate to the upper surface of said interference filter;
    (f) wherein a single crystalline layer is graphotaxially grown from said common substrate through the aperture in each said interference filter and across the surface of each said interference filter, said single crystalline layer suitable for the formation of detector elements; and
    (g) wherein signals representative of the infrared radiation detected by the first detector elements is communicated to processing circuitry and signals representative of the infrared radiation detected by the second detector elements is also communicated to processing circuitry.

2. The infrared detector array as recited in claim 1 further comprising an absorption filter disposed intermediate said first detector elements and said second detector elements to absorb infrared radiation in the first range of wavelengths.

3. The infrared detector array as recited in claim 2 wherein said absorption filter comprises a single crystalline layer of HgCdTe formed upon said common substrate.

4. The infrared detector array as recited in claim 1 wherein the first detector elements are more responsive to infrared radiation in the first range of wavelengths than to infrared radiation in the second range of wavelengths.

5. The infrared detector array as recited in claim 1 wherein said at least one filter element comprises single crystalline layers of HgCdTe formed upon said common substrate.

6. A method for forming an infrared detector array, the infrared detector array simultaneously having two separate spectral responses, the infrared detector array capable of communicating signals representative of infrared radiation detected in two separate ranges of wavelengths to processing circuitry, the method comprising:
    (a) forming a plurality of first detector elements upon a first planar surface of a common substrate for detecting infrared radiation in a first range of wavelengths, the first detector elements being comprised of a photosensitive material which is more sensitive to infrared radiation in the first range of wavelengths than in a second range of wavelengths;
    (b) forming a plurality of second detector elements upon a second planar surface of the common substrate for detecting infrared radiation in the second range of wavelengths, the number of second detector elements substantially conforming to the number of first detector elements, the second planar surface of the common substrate being generally parallel to the first planar surface of the common substrate, the second detector elements being comprised of a photosensitive material which is more sensitive to infrared radiation in the second range of wavelengths; and (c) forming at least one filter intermediate the first and second detector elements for attenuating infrared radiation outside of the second range of wavelengths;

(d) wherein the step of forming at least one filter intermediate the first and second detector elements comprises forming at least one interference filter upon the common substrate intermediate the first detector elements and the second detector elements, each interference filter having at least one aperture formed therein, the aperture providing an opening from said common substrate to the surface of the interference filter not contacting the common substrate; and (e) wherein the step of forming at least one filter intermediate the first and second detector elements further comprises the step of graphotaxially growing a single crystalline layer from said common substrate, through the aperture in said each interference filter and across the surface of said each interference filter, the single crystalline layer being suitable for the formation of detector elements.

7. The method as recited in claim 6 further comprising the step of forming an absorption filter intermediate said first detector elements and second detector elements.

8. The method as recited in claim 6 wherein the step of forming a plurality of first detector elements upon a first planar surface of a common substrate comprises forming a plurality of first detector elements upon a common substrate which absorbs infrared radiation in the first range of wavelengths and transmits infrared radiation in the second range of wavelengths.

* * * * *